(12) United States Patent
Akamatsu et al.

(10) Patent No.: US 6,400,637 B1
(45) Date of Patent: Jun. 4, 2002

(54) SEMICONDUCTOR MEMORY DEVICE

(75) Inventors: Hironori Akamatsu; Toru Iwata; Makoto Kojima, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/673,419

(22) PCT Filed: Apr. 20, 1999

(86) PCT No.: PCT/JP99/02105
§ 371 (c)(1),
(2), (4) Date: Oct. 18, 2000

(87) PCT Pub. No.: WO99/54881
PCT Pub. Date: Oct. 28, 1999

(30) Foreign Application Priority Data

Apr. 21, 1998 (JP) .......................................... 10-110447

(51) Int. Cl.⁷ ................................................ G11C 8/00
(52) U.S. Cl. ................................ 365/230.06; 365/230.3
(58) Field of Search ......................... 365/230.06, 230.3

(56) References Cited

U.S. PATENT DOCUMENTS

| | | | | |
|---|---|---|---|---|
| 5,587,960 A | * | 12/1996 | Ferris | 365/230.03 |
| 5,708,620 A | * | 1/1998 | Jeong | 365/230.06 |
| 5,940,343 A | * | 8/1999 | Cha et al. | 365/230.06 |
| 5,986,938 A | * | 11/1999 | Jang | 365/185.23 |

FOREIGN PATENT DOCUMENTS

| | | |
|---|---|---|
| GB | 2 307 998 | 6/1997 |
| JP | 3-238694 | 10/1991 |
| JP | 6-195964 | 7/1994 |
| JP | 6-195966 | 7/1994 |
| JP | 8-7568 | 1/1996 |
| JP | 08-227597 | 9/1996 |
| JP | 8-335390 | 12/1996 |
| JP | 8-339686 | 12/1996 |
| JP | 10-83672 | 3/1998 |
| JP | 10-289575 | 10/1998 |
| JP | 10-340224 | 12/1998 |
| JP | 11-25669 | 1/1999 |

OTHER PUBLICATIONS

English translation of the International Preliminary Examination Report dated Nov. 21, 2000.

* cited by examiner

Primary Examiner—Son T. Dinh
(74) Attorney, Agent, or Firm—McDermott, Will & Emery

(57) ABSTRACT

Four memory banks (10 to 13), each having a hierarchical word line structure, are provided. If a particular mode for one of the memory banks is specified by a control packet (PKT), a mode recognizer (15) produces the leading edges of change-of-sub-word enable (SEN0–3) and change-of-column enable (CEN–3) signals with the logical level of change-of-main-word enable (MEN0–3) signal fixed. This is done to make activated ones of sub-word and column select lines changeable in each of the memory banks with the same main word line still selected. In this manner, the row access speeds increase for the respective memory banks.

8 Claims, 8 Drawing Sheets

Fig. 5

| mode | specification of control |
|---|---|
| A | change main word lines to be activated |
| B | change sub-word lines to be activated without changing main word lines |
| C | change column select lines to be activated without changing main or sub-word lines |

SEMICONDUCTOR MEMORY DEVICE

TECHNICAL FIELD

The present invention relates to a semiconductor memory device and more particularly relates to a semiconductor memory device with a hierarchical word line structure.

BACKGROUND ART

In recent years, a hierarchical word line structure has been adopted by high-speed, high-density DRAMs (dynamic random access memories) to relax interconnect line pitch limitations. This is a structure in which each word line is made up of a main word line and sub-word lines, which respectively belong to two different layers. One such example is a DRAM disclosed in Japanese Laid-Open Publication No. 6-195964 (published on Jul. 15, 1994). T. Sugibayashi et al. showed an exemplary DRAM using non-multiplexed address input in "A 30 ns 256 Mb DRAM with Multi-Divided Array Structure", ISSCC, Digest of Technical Papers, pp. 50–51, February 1993. In these prior art examples, only part of sub-word lines associated with a common main word line are activated.

In the prior art, however, even in activating multiple sub-word lines associated with a single main word line either sequentially or randomly, a sequence consisting of (1) activating the main word line, (2) activating a sub-word line, (3) deactivating the sub-word line and (4) deactivating the main word line is repeatedly performed. Accordingly, every time sub-word lines to be activated are changed, a main word line needs to be re-selected, thus interfering with increase of row access speeds.

DISCLOSURE OF INVENTION

An object of the present invention is to increase the row access speeds of a semiconductor memory device with a hierarchical word line structure.

To achieve this object, the present invention adopts a construction including first means for activating a main word line and second means for changing activated ones of sub-word lines, which are associated with the main word line in common, while the main word line is being activated. If multiple sub-word lines, associated with a single main word line in common, should be activated either sequentially or randomly using this structure, the sub-word lines to be activated can be changed with the same main word line still selected. Thus, the row access speeds increase compared to the known structure. Preferably, a structure in which the second means is operated only when a particular mode is specified by a given control packet, is employed.

BRIEF DESCRIPTION OF DRAWINGS

FIG. 5 illustrates three modes to be recognized by the mode recognizer shown in FIG. 1.

BEST MODE FOR CARRYING OUT THE INVENTION

Hereinafter, embodiments of the semiconductor memory device of the present invention will be described with reference to the accompanying drawings.

Figure 1:
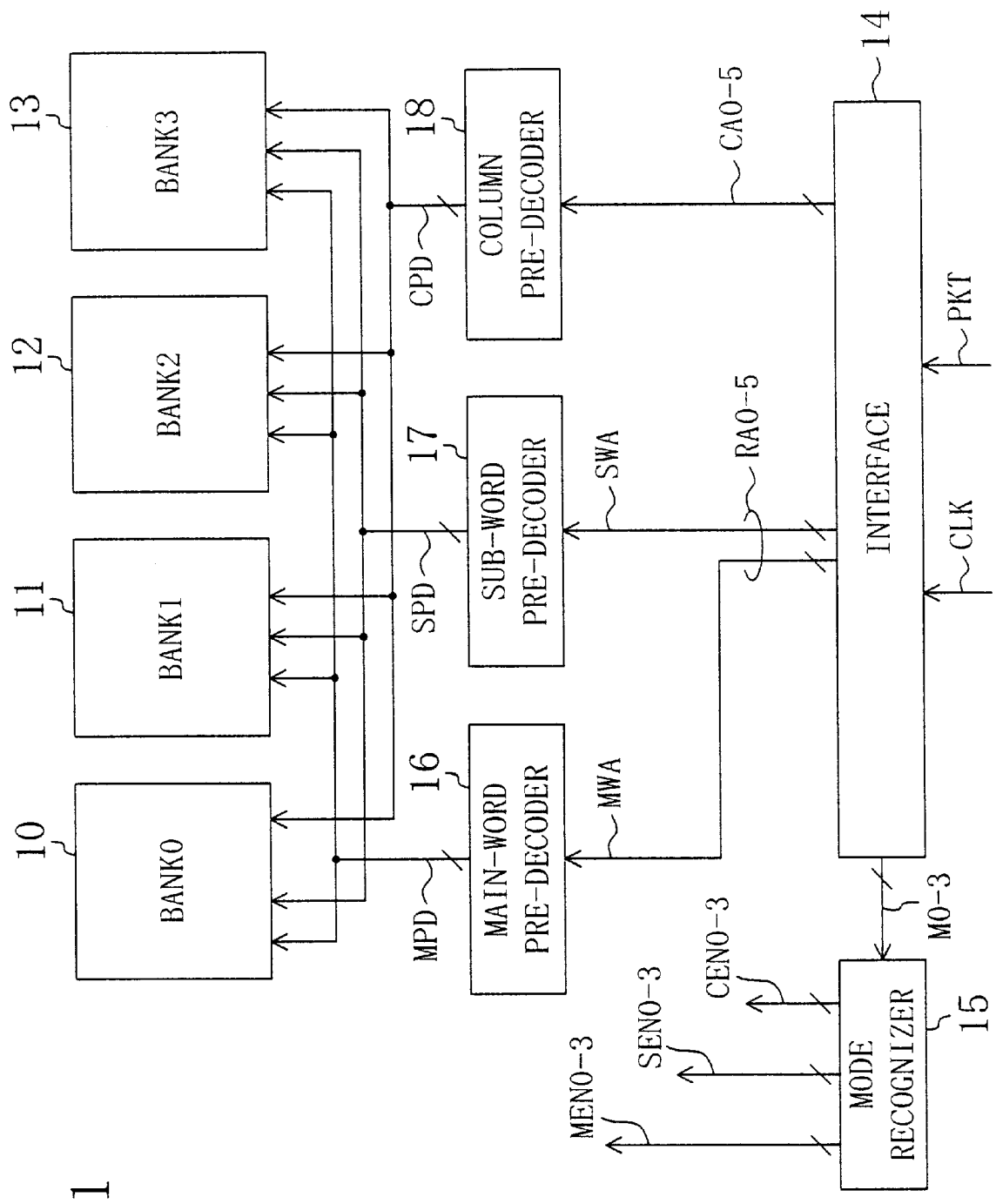
FIG. 1 is a block diagram illustrating an exemplary configuration for a semiconductor memory device according to the present invention.
Figure 2:
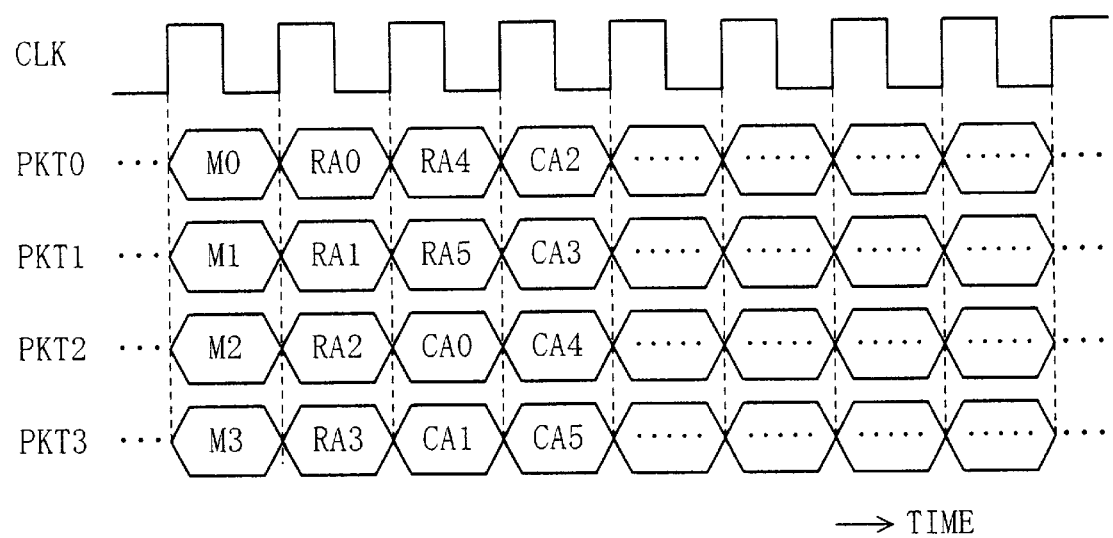
FIG. 2 is a timing chart diagram illustrating in detail a control packet to be supplied to the semiconductor memory device shown in FIG. 1.

FIG. 1 illustrates an exemplary configuration for a DRAM chip according to the present invention. The DRAM chip includes not only four memory banks (BANK0 through BANK3) 10, 11, 12 and 13, each having a hierarchical word line structure, but also interface 14, mode recognizer 15, main-word pre-decoder 16, sub-word pre-decoder 17 and column pre-decoder 18. Synchronously with an external clock (CLK) signal, a control packet PKT is input to the interface 14. As illustrated in FIG. 2, PKT is composed of 4 bits (PKT0 through PKT3). In this example, 3 bits M0 through M3 representing a mode specified for each memory bank, 6 bits RA0 through RA5 representing a row address and 6 bits CA0 through CA5 representing a column address are input as PKT to the DRAM chip during four pulse periods of the CLK signal. As shown in FIG. 1, M0 through M3 specifying the mode is passed to the mode recognizer 15. Part of the row address RA0 through RA5, which represents a main-word address MWA, is supplied to the main-word pre-decoder 16, while the other part thereof, which represents a sub-word address SWA, is supplied to the sub-word pre-decoder 17. The column address CA0 through CA5 is supplied to the column pre-decoder 18. The mode recognizer 15 determines which mode is specified by M0 through M3 and provides control signals representing the result to respective circuit blocks. In FIG. 1, change-of-main-word enable (MEN0 through, MEN3) signals for respective memory banks, change-of-sub-word enable (SEN0 through SEN3) signals for respective memory banks and change-of-column enable (CEN0 through CEN3) signals for respective memory banks are illustrated. The main-word pre-decoder 16, sub-word pre-decoder 17 and column pre-decoder 18 respectively provide main-word pre-decode (MPD) signal, sub-word pre-decode (SPD) signal and column pre-decode (CPD) signal to BANK0 through BANK3. It should be noted that the illustration of a data input/output path and timing signal and other control signals for circuit blocks is omitted from FIG. 1.

Figure 3:
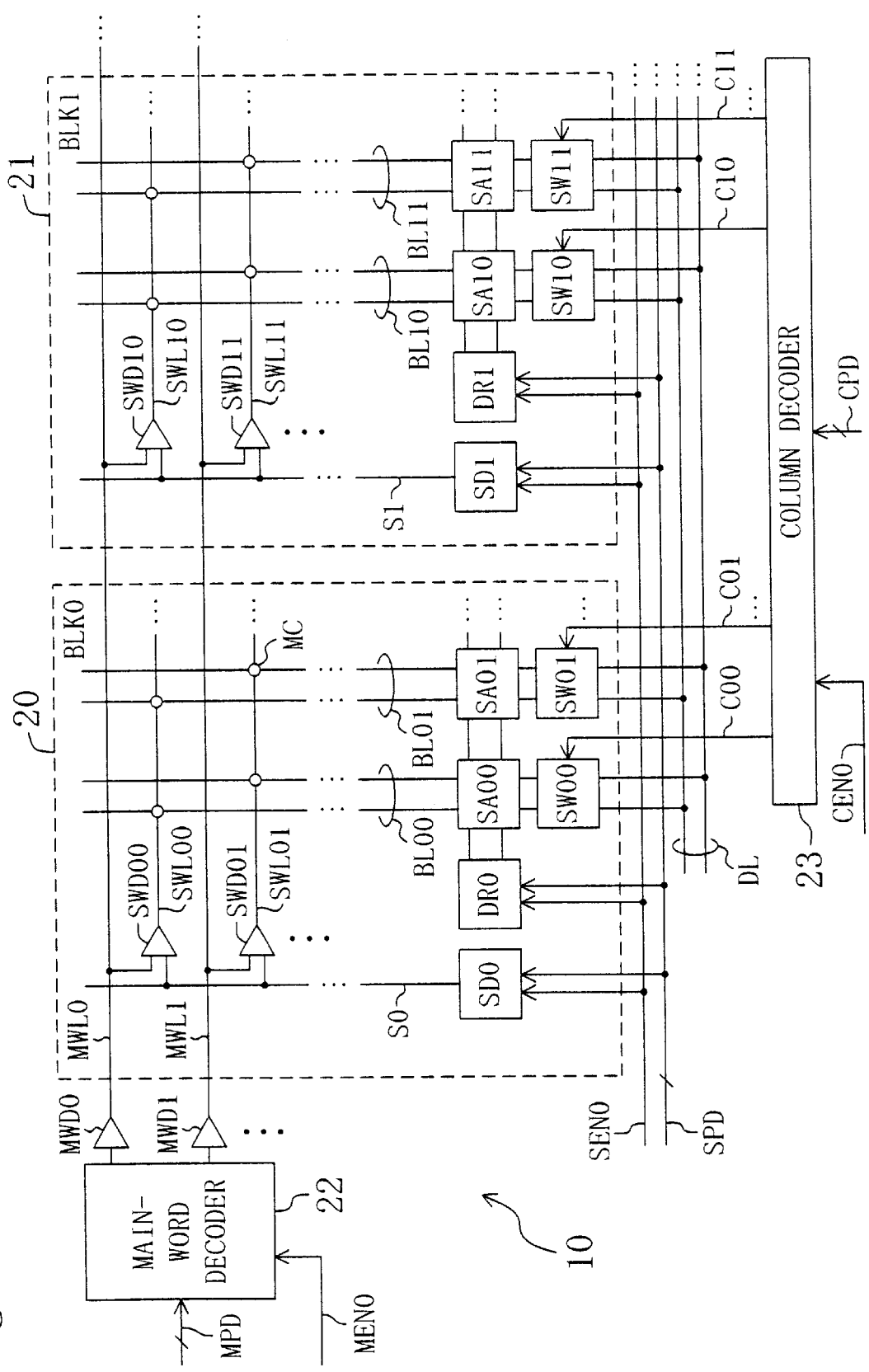
FIG. 3 is a block diagram illustrating a detailed configuration of the memory bank shown in FIG. 1.

FIG. 3 illustrates a detailed configuration of BANK0. BANK0 includes multiple memory blocks, each having the same internal construction, a main-word decoder 22 and a column decoder 23. The actual number of the memory blocks may be eight, for example. However, only two memory blocks (BLK0 and BLK1) 20 and 21 are illustrated for the sake of simplicity of description. BLK0 includes memory cells MC arranged like a matrix, sub-word lines, sub-word-line drivers, a sub-word select line S0, a sub-word decoder SD0, a sense amplifier driver DR0, sense amplifiers, column switches and multiple pairs of bit lines. In FIG. 3, only two sub-word lines SWL00 and SWL01, only two sub-word-line drivers SWD00 and SWD01, only two sense amplifiers SA00 and SA01, only two column switches SW00 and SW01 and only two bit line pairs BL00 and BL01 are illustrated to simplify the description. Each of SWL00 and SWL01 is connected to associated ones of the memory cells. In response to the leading edge of the MEN0 signal, the main-word decoder 22 latches the MPD signal and makes one of main-word-line drivers activate an associated one of the main word lines responsive to the MPD signal latched. In FIG. 3, just two main word lines MWL0 and MWL1 and just two main-word-line drivers MWD0 and MWD1 are illustrated for the sake of simplicity. In response to the leading edge of the SEN0 signal, SD0 latches the SPD signal and determines, responsive to the SPD signal latched, whether or not S0 should be activated. If MWL0 and S0 have both been activated, SWD00 activates SWL00. If MWL1 and S0 have both been activated, SWD01 activates SWL01. In response to the leading edge of the SEN0 signal, DR0 latches the SPD signal and determines, responsive to the SPD signal latched, whether or not a voltage should be applied to operate SA00 and SA01. Specifically, if BLK0 has been specified by the SPD signal, then S0 is activated by SD0 and SA00 and SA01 are activated by DR0. Each of SA00 and SA01 are coupled to associated ones of the memory cells through BL00 and BL01, respectively. In response to the leading edge of the CEN0 signal, the column decoder 23 latches the CPD signal and activates, responsive to the CPD signal latched, one of multiple column select lines. In FIG. 3, only four column select lines C00, C01, C10 and C11 are illustrated for the sake of simplicity. If C00 has been activated, then SW00 connects BL00 to a data line pair DL. If C01 has been activated, then SW01 connects BL01 to the data line pair DL. In BLK1, SWL10 and SWL11 denote sub-word lines, SWD10 and SWD11 denote sub-word-line drivers, S1 denotes a sub-word select line, SD1 denotes a sub-word decoder, DR1 denotes a sense amplifier driver, SA10 and SA11 denote sense amplifiers, SW10 and SW11 denote column switches and BL10 and BL11 denote bit line pairs. SWL00 and SWL10 are associated with the main word line MWL0 in common and SWL01 and SWL11 are associated with the main word line MWL1 in common. Also, each of BANK1 through BANK3 has the same internal construction as that illustrated in FIG. 3.

Figure 4:
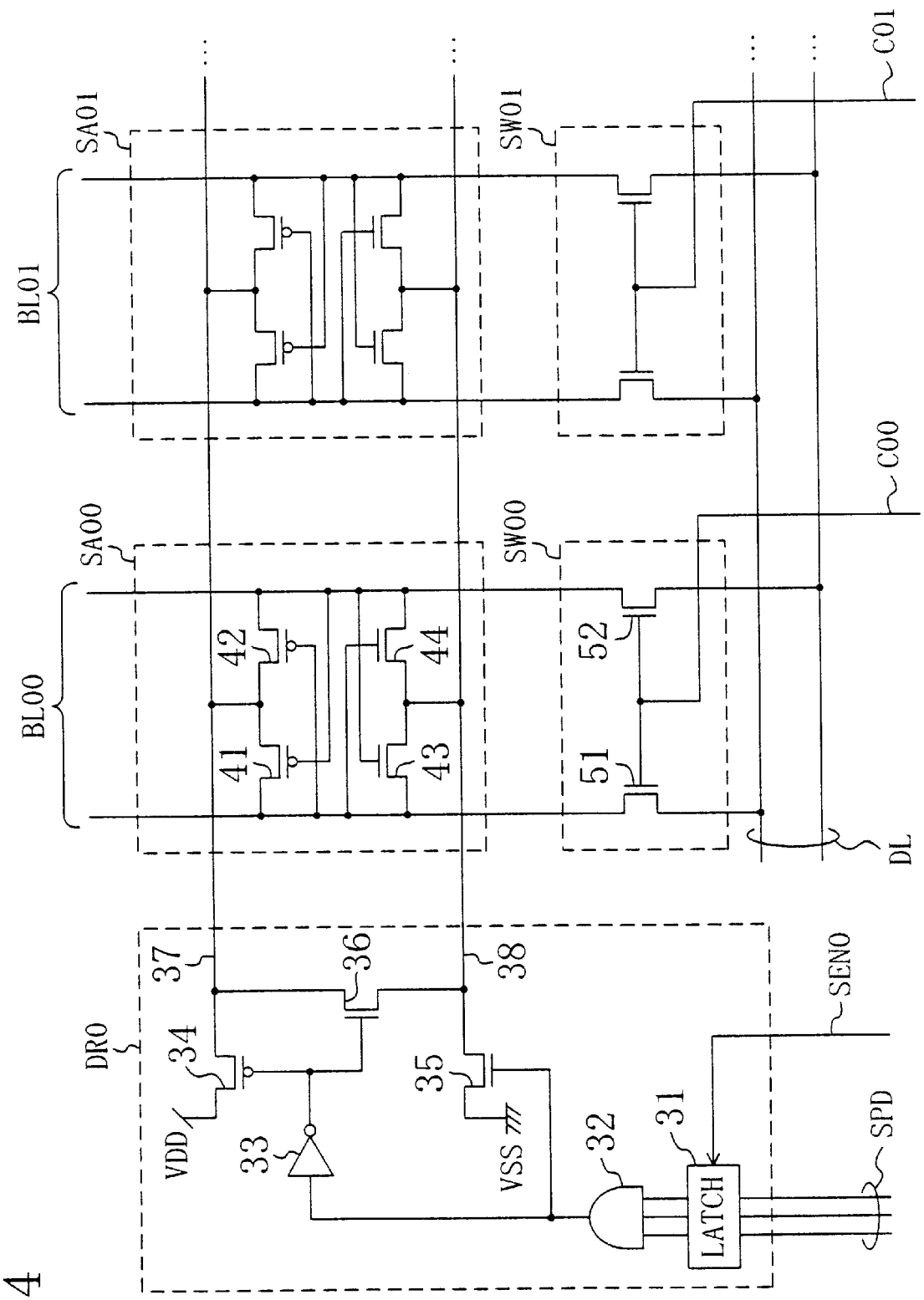
FIG. 4 is a circuit diagram illustrating detailed configurations of the sense amplifier driver, sense amplifiers and column switches shown in FIG. 3.

FIG. 4 illustrates a detailed configuration of a part of BLK0. DR0 includes: a latch 31 for retaining the SPD signal responsive to the leading edge of the SEN0 signal; a decoder 32 for decoding the SPD signal retained in the latch 31; an inverter 33; a PMOS transistor 34; and two NMOS transistors 35 and 36. If the output of the decoder 32 is High, then DR0 applies a voltage for operating SA00 and SA01 (i.e., a differential voltage between VDD and VSS) between two signal lines 37 and 38. If the output of the decoder 32 is Low, then the NMOS transistor 36 equalizes the voltages on the signal lines 37 and 38 with each other. SA00 is made up of two PMOS transistors 41 and 42 and two NMOS transistors 43 and 44. SW00 is made up of two NMOS transistors 51 and 52.

FIG. 5 illustrates specifications of three modes to be recognized by the mode recognizer 15. Hereinafter, it will be described how to specify a mode for BANK0. In Mode A, the leading edges of the MEN0, SEN0 and CEN0 signals are produced in such a manner that the main word lines, sub-word lines and column select lines to be activated can be changed. In Mode B, the leading edges of the SEN0 and CEN0 signals are produced with the logical level of the MEN0 signal fixed so that the sub-word lines and column select lines to be activated can be changed with the same main word line still selected. In Mode C, the leading edge of the CEN0 signal is produced with the logical levels of the MEN0 and SEN0 signals both fixed so that the column select lines to be activated can be changed with the same main word line and the same sub-word line still selected. It should be noted that if another particular mode has been specified by M0 through M3, then the mode recognizer 15 can generate a control signal that deactivates all of the main word, sub-word and column select lines. If this particular mode has been specified, the MEN0, SEN0 and CEN0 signals are all negated. Alternatively, three modes may be additionally defined to deactivate the main word lines, sub-word lines and column select lines individually.

Figure 6:
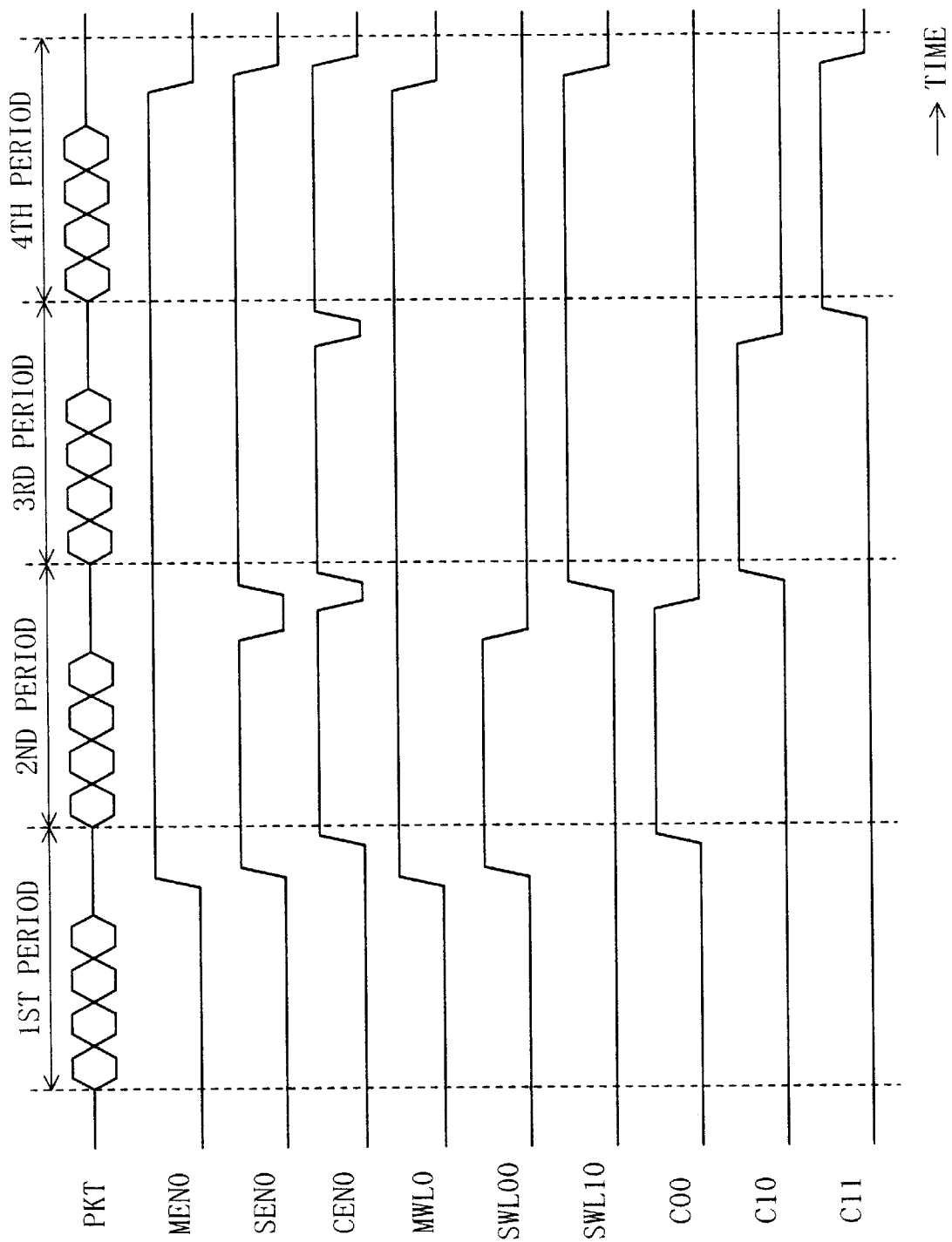
FIG. 6 is a timing chart diagram illustrating an exemplary operation of the semiconductor memory device shown in FIG. 1.

FIG. 6 illustrates an exemplary data read operation performed on BANK0. Herein, this operation will be described for each of the four periods illustrated in FIG. 6.

In the first period, PKT, including bits specifying Mode A, a row address specifying MWL0 and BLK0 and a column address specifying C00 is input. On receiving those bits specifying Mode A, the mode recognizer 15 generates the leading edges of the MEN0, SEN0 and CEN0 signals. As a result, only SWL00 is activated among multiple sub-word lines associated with MWL0, only DR0 operates among multiple sense amplifier drivers and a plurality of sense amplifiers, including SA00 and SA01, are lactivated. And when C00 is activated, SW00 opens so that data stored on a specified memory cell in BLK0 is read out onto DL. In the meantime, SWL10, for example, is not activated and DR1 applies no voltage to operate the sense amplifiers.

In the second period, PKT, including bits specifying Mode B, a row address specifying BLK1 and a column address specifying C10, is input. On receiving those bits specifying Mode B, the mode recognizer 15 once negates the SEN0 and CEN0 signals with the logical level of the MEN0 signal fixed and then generates the leading edges of the SEN0 and CEN0 signals. As a result, SWL10 and C10 are activated in place of SWL00 and C00, respectively, with MWL00 still selected, and data stored on a specified memory cell in BLK1 is read out onto DL.

In the third period, PKT, including bits specifying Mode C and a column address specifying C11, is input. On receiving those bits specifying Mode C, the mode recognizer 15 once negates the CEN0 signal with the logical levels of the MEN0 and SEN0 signals fixed and then generates the leading edge of the CEN0 signal. As a result, C11 is activated in place of C10 with MWL00 and SWL10 still selected, and data stored on a specified memory cell in BLK1 is read out onto DL.

In the fourth period, PKT, including bits specifying a mode in which the main word, sub-word and column select lines are all deactivated, is input. As a result, the MEN0, SEN0 and CEN0 signals are all negated and MWL0, SWL10 and C11 are all deactivated.

Figure 7:
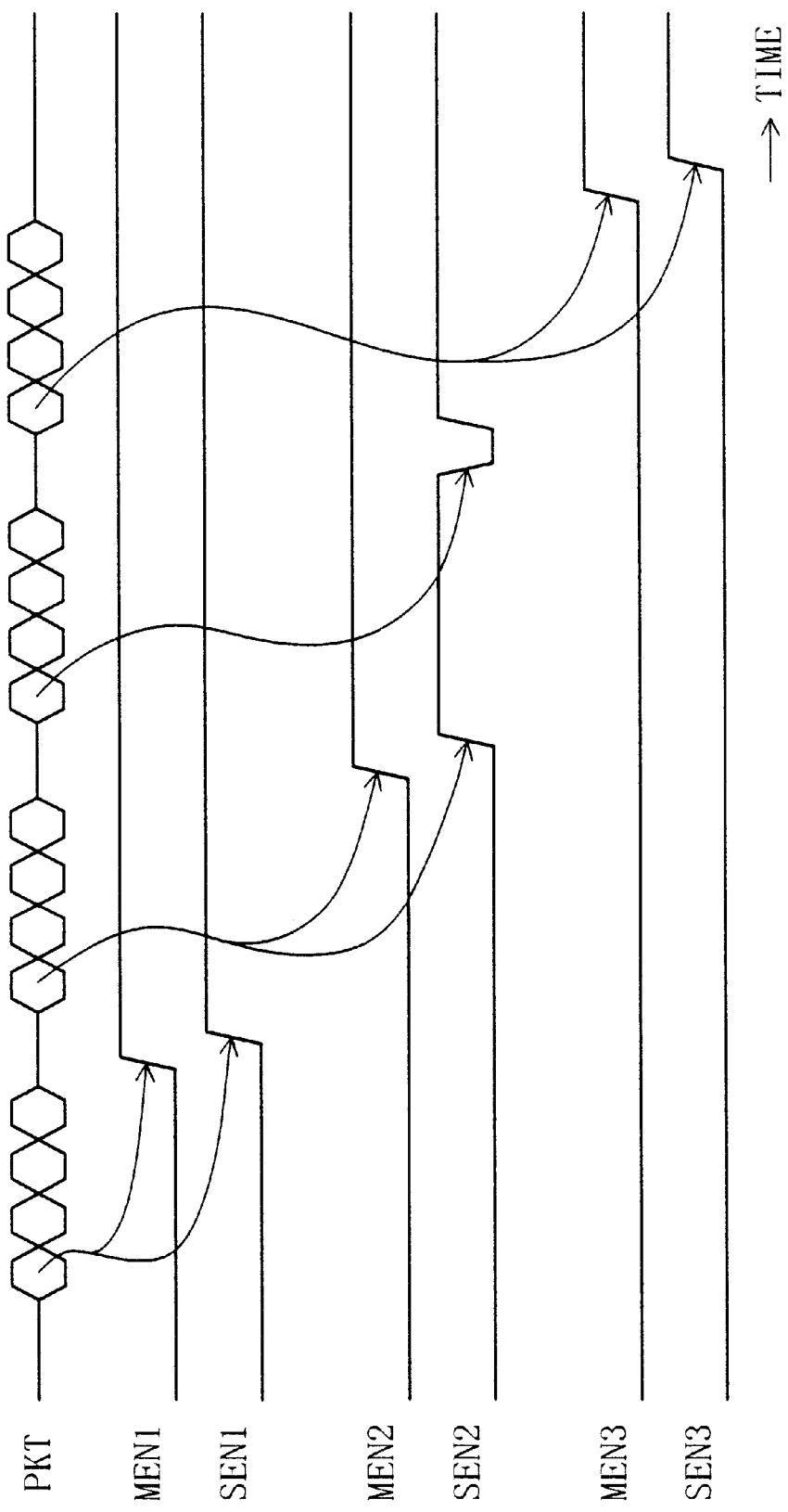
FIG. 7 is a timing chart diagram illustrating another exemplary operation of the semiconductor memory device shown in FIG. 1.

FIG. 7 illustrates another exemplary operation of the DRAM chip shown in FIG. 1. In the example illustrated in FIG. 7, M0 through M3 in PKT specifies Mode A for BANK1, Mode A for BANK2, Mode B for BANK3 and then Mode A for BANK3 in this order. In the configuration shown in FIG. 1, multiple memory banks can be activated at a time and modes can be set independently for the respective memory banks.

As described above, in the DRAM chip with such a configuration, while a main word line is being activated, activated ones of multiple sub-word lines, associated with this main word line, can be changed. Thus, the row access speeds increase compared to the prior art. In addition, only a sub-word line and sense amplifiers, which belong to a specified one of multiple, memory blocks, are activated, thus cutting down the power consumption of the DRAM chip. This effect of power consumption reduction is particularly noticeable in a DRAM chip in which multiple memory banks are activated at a time. Also, only when Mode B is specified, the sub-word lines to be activated can be changed with the same main word line still selected. In the other modes, however, other operations are selectable. As a result, the DRAM chip can be used more flexibly. Furthermore, since an address is input using a control packet, the number of pins needed for the DRAM package can be reduced compared to non-multiplexed address input. It should be noted, however, that the present invention is also applicable to a DRAM chip with a single bank structure or to a DRAM using no control packets.

In the foregoing example, part of a row address represents a sub-word address. Alternatively, part of a column address may represent the sub-word address. Also, each memory bank may have a configuration so designed as to read a burst of bits. The bit width of the control packet is not limited to the exemplified one but may be an arbitrary value. Furthermore, various other modes, including refresh, test and power-down modes, may be defined using the control packet.

In the foregoing example, just one sub-word line is supposed to be activated among multiple sub-word lines associated with a common main word line. Accordingly, the number of memory cells that can be accessed consecutively in the so-called "page mode" is much smaller than a situation where the hierarchical word line structure is not adopted. That is to say, the page length shortens. If the page length, is preferably extended, then the configuration may be modified in such a manner as to activate at least two sub-word lines at a time.

Figure 8:
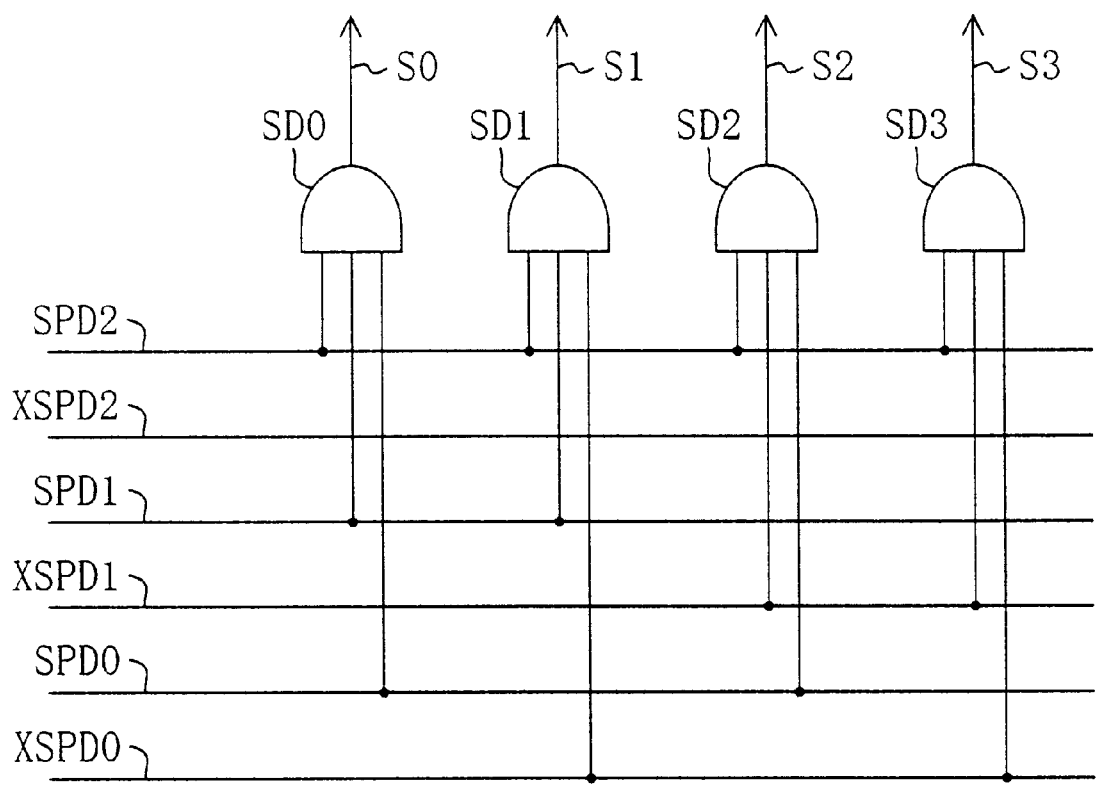
FIG. 8 is a circuit diagram illustrating a detailed configuration of the sub-word decoders shown in FIG. 3.

FIG. 8 illustrates a detailed configuration for sub-word decoders in BANK0, which is suitable for the page length extension. In FIG. 8, not only SD0, SD1, S0 and S1 shown in FIG. 3 but also two other sub-word decoders SD2 and SD3 and two other sub-word select lines S2 and S3 are illustrated. However, the illustration of the latch for retaining the SPD signal responsive to the leading edge of the SEN0 signal is omitted. As shown in FIG. 8, the SPD signal is transmitted through at least six signal lines SPD2, XSPD2, SPD1, XSPD1, SPD0 and XSPD0. SPD2 and XSPD2 make a pair of complementary signal lines. SPD1 and XSPD1 make another pair of complementary signal lines. And SPD0 and XSPD1 make still another pair of complementary signal lines. SD0 is so constructed as to activate S0 while the logical levels of SPD2, SPD1 and SPD0 are High. SD1 is so constructed as to activate S1 while the logical levels of SPD2, SPD1 and XSPD0 are High. SD2 is so constructed as to activate S2 while the logical, levels of SPD2, XSPD1 an d SPD0 are High. And SD3 is so constructed as to activate S3 while the logical levels of SPD2, XSPD1 and XSPD0 are High.

In the configuration shown in FIG. 8, the logical level of one of the signal lines SPD2 and XSPD2, the logical level of one of the signal lines SPD1 and XSPD1 and the logical level of one of the signal lines SPD0 and XSPD0 are usually set High. In that case, two or more of the sub-word select lines S0, S1, S2 and S3 are not activated at a time. To activate S0 and S1 at a time so that the page length can be extended, the logical levels of SPD2, SPD1, SPD0 and XSPD0 are set High. In that case, one sub-word line in BLK0 and another one sub-word line in BLK1 are activated at the same time. In response, each of DR0 and DR1 applies a voltage to operate multiple sense amplifiers. To activate four sub-word lines simultaneously, the logical levels of SPD2, SPD1, XSPD1, SPD0 and XSPD0 may be set High.

INDUSTRIAL APPLICABILITY

According to the present invention, a DRAM chip with increased row access speeds is provided. However, the present invention is also applicable to any semiconductor memory device other than the DRAM types so long as the device has the hierarchical word line structure.

What is claimed is:

1. A semiconductor memory device with a hierarchical word line structure, characterized by comprising:

a plurality of memory cells;

a plurality of sub-word lines, each being connected to an associated one of the memory cells;

a main word line, with which the sub-word lines are associated in common;

first means for activating the main word line;

second means for changing activated ones of the sub-word lines while the main word line is maintained in an active state;

means for inputting a control packet; and means for operating the second means when a particular mode is specified by the control packet.

2. A semiconductor memory device with a hierarchical word line structure comprising multiple banks, characterized in that each said bank includes:

a plurality of memory cells;

a plurality of sub-word lines, each being connected to an associated one of the memory cells;

a main word line, with which the sub-word lines are associated in common;

first means for activating the main word line; and second means for changing activated ones of the sub-word lines while the main word line is maintained in an active state.

3. The semiconductor memory device of claim 1, characterized by further comprising means for activating at least two of the sub-word lines at a time.

4. The semiconductor memory device of claim 2, characterized by further comprising means for activating at least two of the sub-word lines at a time.

5. The semiconductor memory device of claim 1, characterized by further comprising:

a plurality of sense amplifiers, each being coupled to an associated one of the memory cells; and means for activating only one of the sense amplifiers that is coupled to one of the memory cells that is connected to the activated one of the sub-word lines.

6. The semiconductor memory device of claim 2, characterized by further comprising:

a plurality of sense amplifiers, each being coupled to an associated one of the memory cells; and means for activating only one of the sense amplifiers that is coupled to one of the memory cells that is connected to the activated one of the sub-word lines.

7. The semiconductor memory device of claim 1, further comprising means for generating a plurality of control signals including a first control signal which effects the deactivation of a selected sub-word line and maintains a selected main word line in an active state, and a second control signal which effects the deactivation of a selected sub-word line and a selected main word line.

8. The semiconductor memory device of claim 2, further comprising means for generating a plurality of control signals including a first control signal which effects the deactivation of a selected sub-word line and maintains a selected main word line in an active state, and a second control signal which effects the deactivation of a selected sub-word line and a selected main word line.

* * * * *